(12) United States Patent
Trotta

(10) Patent No.: US 8,797,078 B2
(45) Date of Patent: Aug. 5, 2014

(54) LATCH CIRCUIT, FLIP-FLOP CIRCUIT AND FREQUENCY DIVIDER

(75) Inventor: Saverio Trotta, Munich (DE)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/811,921

(22) PCT Filed: Jul. 27, 2010

(86) PCT No.: PCT/IB2010/053408
§ 371 (c)(1),
(2), (4) Date: Jan. 24, 2013

(87) PCT Pub. No.: WO2012/014013
PCT Pub. Date: Feb. 2, 2012

(65) Prior Publication Data
US 2013/0127502 A1 May 23, 2013

(51) Int. Cl.
*H03K 3/286* (2006.01)
(52) U.S. Cl.
USPC ........... 327/223; 327/115; 327/117; 327/118; 327/202; 377/47
(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | |
|---|---|---|
| 4,540,900 A | 9/1985 | Early et al. |
| 7,176,736 B2 | 2/2007 | Edwards |
| 7,663,414 B2 * | 2/2010 | Copani et al. ................. 327/115 |
| 8,130,018 B2 | 3/2012 | Saverio |
| 2003/0141924 A1 | 7/2003 | Cosand |

(Continued)

FOREIGN PATENT DOCUMENTS

| | | |
|---|---|---|
| JP | 63-187817 A | 3/1988 |
| JP | 03-195113 A | 8/1991 |
| WO | 20090115865 A1 | 9/2009 |

OTHER PUBLICATIONS

International Search Report and Written Opinion correlating to PCT/IB2010/053408 dated Aug. 14, 2010.

*Primary Examiner* — Brandon S Cole

(57) ABSTRACT

The invention pertains to a latch circuit comprising a sensing arrangement with one or more sensing transistors adapted to sense an input signal and to provide a first signal based on the sensed input signal, and a sensing arrangement switch device connected or connectable to a first current source, the sensing arrangement switch device being adapted to switch on or off a current to the one or more sensing transistors based on a first clock signal. The latch circuit further comprises a storage arrangement with one or more storage transistors adapted to store the first signal and to provide a second signal based on the first signal, and a storage arrangement switching device connected or connectable to the first current source or a second current source, the storage arrangement switching device being adapted to switch on or off a current to the storage transistors based on a second clock signal, as well as a tuning arrangement connected or connectable to a temperature sensor, the tuning arrangement being adapted to bias a current of the sensing arrangement and/or the storage arrangement based on a temperature signal provided by the temperature sensor. The invention also pertains to a flip-flop circuit with two or more latch circuits and a frequency divider comprising at least one latch circuit as described.

20 Claims, 7 Drawing Sheets

(56) References Cited

U.S. PATENT DOCUMENTS

| | | |
|---|---|---|
| 2005/0156765 A1 | 7/2005 | Kaplan |
| 2005/0231258 A1* | 10/2005 | Suzuki et al. .................. 327/218 |
| 2007/0001719 A1* | 1/2007 | Hulfachor et al. ............. 327/117 |
| 2007/0182469 A1* | 8/2007 | Zimlich ......................... 327/158 |
| 2011/0018594 A1* | 1/2011 | Saverio ......................... 327/118 |

\* cited by examiner

US 8,797,078 B2

LATCH CIRCUIT, FLIP-FLOP CIRCUIT AND FREQUENCY DIVIDER

FIELD OF THE INVENTION

This invention relates to a latch circuit, a flip-flop circuit and a frequency divider.

BACKGROUND OF THE INVENTION

Frequency dividers find a broad use in modern electronic technology. They are often used in e.g. in transmitters or receivers but may also find use in the context of clock-driven electronic devices such as e.g. microcontrollers or microchips.

Frequency dividers are regularly constructed using latch circuits arranged in a way to provide the desired division of frequency. In particular, latch circuits may be combined to flip-flops, which may be utilized in frequency dividers and other devices. In many cases, transistors are used as components of the flip-flop devices. Flip-flop circuits respectively frequency dividers usually have a preferred frequency range of operation and in particular a given resonance frequency or self oscillatory frequency depending on the characteristics of the electronic components. These frequencies may show a drifting behaviour over time due to external or internal issues.

In WO 2009/115865 A1 there is described a latch module for a frequency divider with a current injector providing asymmetric operation of a sense pair of transistors and a regenerative pair of transistors to change a self oscillatory frequency of the frequency divider.

SUMMARY OF THE INVENTION

The present invention provides a latch circuit, a flip-flop circuit and a frequency divider as described in the accompanying independent claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention. In the context of the specification it may be assumed that any device capable of switching on and off a current may also be able to control a strength of the current switched. A current strength control and/or a switching may be performed based on a control current or control voltage, for example in the context of transistors. A control of the current may be performed continuously. Latch circuits as described below may be combined, with similar latch circuits or with other latch circuits, to form e.g. a flip-flop circuit, in particular a flip-flop circuit of a frequency divider.

Figure 1:
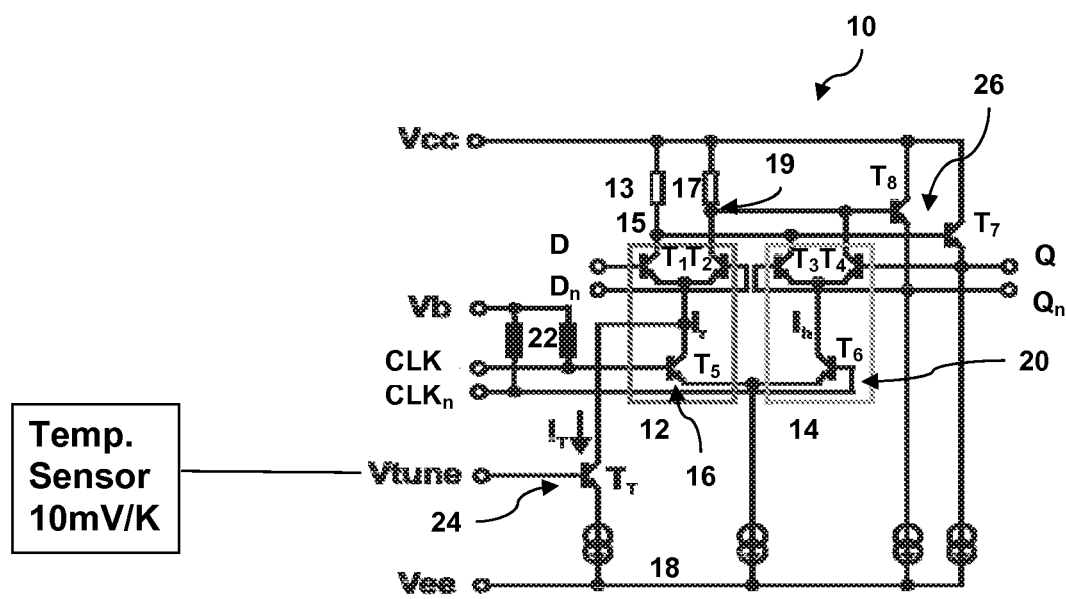
FIG. 1 schematically shows an example of a latch circuit.

FIG. 1 schematically shows a latch circuit 10. Latch circuit 10 may comprise a sensing arrangement 12 and a storage arrangement 14.

The sensing arrangement 12 may comprise a sensing section, which may include one or more sensing transistors adapted to sense an input signal and to provide a first signal based on the sensed input signal. As shown in FIG. 1, the sensing section may comprise sensing transistors $T_1$ and $T_2$, which may be considered as an input differential pair of transistors of the latch circuit 10. The input signal, which may be a differential signal, may have components D and $D_n$. Clock circuit 10 may have corresponding terminals to receive the input signal respectively its components. It may be considered that sensing arrangement 12 comprises a sensing arrangement switch device 16, which may be connected or connectable to a first current source 18. The sensing arrangement switch device 16 may be adapted to switch on or off a current of the sensing arrangement 12 based on a first clock signal CLK. In particular, switch device 16 may be adapted to switch on or off a current, which may originate from the first current source, to the sensing section respectively the sensing transistors. The current to the sensing section may be switched through at the sensing section based on the input signal, which may provide a control voltage respectively a control current for the sensing section or components of the sensing section. There may be provided an electrical connection between the sensing arrangement switch device 16 and the sensing section respectively the sensing transistors $T_1$, $T_2$ enabling the flow of a current $I_r$. Current $I_r$ may at least be partially supplied by the first current source 18. It may be considered that the sensing section and the sensing arrangement switch device 16 constitute separate parts of the sensing arrangement 12, the sensing arrangement switch device 16 being connected to the sensing section to switch respectively control a flow of current of respectively to the sensing section.

The storage arrangement 14 may comprise a storage section, which may include one or more storage transistors adapted to store the first signal provided by the sensing arrangement 12 and to provide a second signal based on the first signal. The latch circuit 10 shown in FIG. 1 may comprise storage transistors $T_3$, $T_4$. Transistors $T_3$ and $T_4$ may be considered to be a regenerative pair of transistors of the latch circuit 10. Storage arrangement 14 may comprise a signal arrangement switching device 20 connected or connectable to the first current source 18 or to a second current source. The storage arrangement switching device 20 may be adapted to switch on or off a current to the storage section respectively the storage resistors or the regenerative pair of transistors based on a second clock signal. The current may originate from the current source the storage arrangement is connected to. There may be provided an electrical connection between the storage arrangement switch device 16 and the storage section respectively the storage transistors $T_3$, $T_4$ enabling the flow of a current $I_h$. It may be considered that the storage section and the storage arrangement switch device 20 constitute separate parts of the storage arrangement 14, the storage arrangement switch device 20 being connected to the storage section to control the flow of current of respectively to the storage section.

The second clock signal may be the complement of the first clock signal CLK. In the case of FIG. 1, the complement of clock signal CLK is denoted as $CLK_n$. Latch circuit 10 may comprise corresponding terminals to receive clock signals, e.g. clock signals CLK and $CLK_n$. A bias voltage $V_b$ may be applicable to the clock signal CLK and the complement $CLK_n$ via a circuit comprising suitable resistors 22 to bias these signals.

The latch circuit 10 may also comprise a tuning arrangement 24 connected or connectable to a temperature sensor, the tuning arrangement 24 being adapted to bias a current of the sensing arrangement and/or the storage arrangement based on a temperature signal provided by the temperature sensor. In particular, tuning arrangement 24 may be adapted to bias a current to the sensing section and/or to the storage section. It may be considered that the temperature signal is indicative of the actual temperature of the latch circuit 10 or components of an electronic device the latch circuit 10 is a part of. The tuning arrangement 24 may be adapted to provide a tuning current $I_T$ for biasing the current of the sensing arrangement 12 to the sensing arrangement 12 respectively the sensing section and/or the storage arrangement 14 respectively the storage section based on the temperature signal. It may be considered that the tuning arrangement 24 is connected or connectable to the first, the second or a third current source. The third current source may be identical to the first current source 18 and/or the second current source. The tuning current $I_T$ may be based on a current provided by the current source the tuning arrangement 24 is connected to. In particular, the tuning arrangement 24 may be adapted to switch, control or continuously control a current provided by the first, second or third current source to supply it as a tuning current $I_T$. It may be envisioned that a single current source is used as first, second and third current source, in which case only one current source 18 is present as shown in FIG. 1. First and/or second and/or third current source may be independent of each other. Supply rails $V_{ee}$ and $V_{cc}$ may be arranged to provide an operational voltage and current. The tuning arrangement 24 may be adapted to receive the temperature signal as a voltage $V_{tune}$.

The clock signal CLK may be provided to a transistor $T_5$, which may be seen as part of the sensing arrangement switching device 16. The complement $CLK_n$ of the clock signal may be provided to a transistor $T_6$, which may be seen as a part of the storage arrangement switching device 20. Transistors $T_5$ and $T_6$ of switching devices 16, 20 may operate as gate transistors and may be connected to the supply rail $V_{ee}$. Transistor $T_5$ may switch on a current from the current source 18 to sensing transistors $T_1$ and $T_2$ of the sensing arrangement 12 at the rising edge of clock pulse CLK, the current flowing via gate transistor $T_5$ representing at least a part of current $I_r$ of the sensing arrangement 12. The storage switch gate transistor $T_6$ may switch on a current to from the current source 18 to storage transistors $T_3$ and $T_4$ on the rising edge of the complement $CLK_n$ of the clock signal. During the time the transistor $T_5$, respectively the sensing arrangement switch device 16, the sensing arrangement 12 or the sensing section, is switched on, the transistor $T_6$ may be switched off. If the transistor $T_6$, respectively the storage arrangement switch device 20, the storage arrangement 12 or the storage section, is switched on in response to an edge, in particular a rising edge, of the complement $CLK_n$ of the clock signal, the sensing arrangement switch device 16, respectively gate transistor $T_5$ of the sensing arrangement 12, may switch off. Transistor $T_6$, respectively the storage arrangement switching device 20, may also be controlled by a different clock signal instead of the complement of clock signal CLK.

It may be feasible that any kind of device capable of switching currents is used instead of or additional to a gate transistor for one or more of the switch devices 16, 20. The period during which the sensing arrangement 12, respectively the sensing section, is sensing an input signal may be called sense period or sense phase. The period during which the storage arrangement 14 stores a signal provided by the sensing section may be called store period or store phase. By utilizing the tuning arrangement 24 and biasing a current level, the period lengths are not solely determined by the external clock signals. A current $I_r$ flowing between the sensing arrangement switch device 16 and the sensing section may be considered as a current of the sensing arrangement. A current $I_h$ flowing between the storage arrangement switch device 20 and the storage section may be considered to be a current of the storage arrangement.

Triggering of the switch devices 16, 20 respectively gate transistors $T_5$ and $T_6$ may be performed in any suitable way. A switch device respectively transistor may, for example, be level-triggered or triggered by a rising or falling edge. It is e.g. possible to have one of the gate transistors $T_5$ and $T_6$ triggered by a rising or falling edges, and the other gate transistor by the other edge or by a level. The sensing arrangement 12 and the storage arrangement 14 may operate in a flip-flop, in particular in a D-flip-flop. Sensing arrangement switch device 16 and/or storage arrangement switch device 20 may be adapted to switch, control and/or continuously control a current to the sensor section respectively the storage section.

The latch circuit 10 may comprise a level-shift module 26 for producing a differential output signal with components Q, $Q_n$ at corresponding output terminals of the latch circuit 10. In particular, the level-shift module may comprise transistors $T_7$ and $T_8$. The emitter of transistor $T_7$ respectively $T_8$ may be connected to supply rail $V_{ee}$ via a node connect to the base of the storage transistor $T_4$ respectively $T_3$. The collectors of transistors $T_7$, $T_8$ may be connected to supply rail $V_{cc}$. The collectors of transistors $T_1$, $T_2$ of the sensing arrangement 12 and $T_3$ and $T_4$ of the storage arrangement 14 may be connected to supply rail $V_{cc}$ via suitable resistors 13, 17. A node 15 providing a connection between transistors $T_1$, $T_3$ and $T_7$ may be arranged between the collector of transistor $T_1$ of the sensing section and resistor 13. Between node 15 and the base of transistor $T_7$ there may be arranged another node with a branch to the collector of transistor $T_3$. Between transistor $T_2$ of the sensing section and resistor 17 there may be arranged a node 19, providing a connection between transistors $T_2$, $T_4$ and $T_8$. A further node may be arranged between node 19 and the base of transistor $T_8$, from which a connection to the collector of transistor $T_4$ may branch off. Input signal D respectively $D_n$ may be provided to the base of transistor $T_1$ respectively $T_2$. The clock signal CLK respectively $CLK_n$ may be applied to the base of gate transistor $T_5$ respectively $T_6$ to enable switching respectively control of the current of the sensing arrangement 12 respectively the storage arrangement 14. The storage section may output signals via the bases of storage transistors T3, T4. These signals may be amplified using the level-shift modules 26, respectively transistors $T_7$, $T_8$ and be output as signal Q, $Q_n$. If gate transistor $T_6$ of the storage arrangement 14 switches on, a current $I_h$ may be provided to the emitters of transistors $T_3$, $T_4$ of the storage arrangement 14. Similarly, if gate transistor $T_5$ switches on, a current $I_r$ may be provided to the emitters of $T_1$, $T_2$ of the sensing arrangement 12. $V_x$, $V_y$ denote voltages applying in the sensing and storage paths of the latch circuit 10 at node 15 respectively 19. $V_x$, $V_y$ change in response to the gate transistors $T_5$, $T_6$ switching on or off the sensing arrangement 12 or the storage arrangement 14 in response to the clock signals CLK, $CLK_n$.

The tuning arrangement 24 may enable asymmetric operation of the sensing arrangement 12 and the storage arrangement 14. In particular, the current level in the sensing arrangement 12 and the storage arrangement 14 may be asymmetric due to the operation of the tuning arrangement 24. The tuning arrangement 24 may provide a tuning current for biasing the current of the sensing arrangement 12 and/or the storage arrangement 14. The tuning arrangement may be connected to a connection point between the sensing section of the sensing arrangement and the sensing arrangement switch device and/or a connection point between the storage section of the storage arrangement and the storage arrangement switch device to bias the current of the sensing arrangement and/or the storage arrangement. It is feasible that the tuning arrangement 24 is adapted to bias the current level of the sensing arrangement and/or the storage arrangement such that the current level in the sensing arrangement 12 when the sensing arrangement switch device 16 is switched off is higher than the current level in the storage arrangement 14 when then storage arrangement switch device 20 is switched off.

An electrical connection between the tuning arrangement 24 and the sensing section bypassing the sensing arrangement switching device 16 and/or between the tuning arrangement 24 and the storage section bypassing the storage arrangement switching device 20 may be envisioned. As shown in FIG. 1, the tuning arrangement 24 may comprise a tuning transistor $T_T$, the emitter of which may be connected to the supply rail $V_{ee}$. The collector of transistor $T_T$ may be connected to a connection point between the gate transistor $T_5$ and the sensing transistors $T_1$, $T_2$ of the sensing arrangement 12. The tuning transistor $T_T$ may serve as a switch to switch on or switch off a tuning current $I_T$ from the first, second or third current source. It may be considered that the tuning arrangement 24 provides a tuning current $I_T$ bypassing the sensor arrangement switch device 16. In particular, it may bypass gate transistor $T_5$. The tuning current $I_T$ may constitute a part of the current $I_r$ flowing between the sensing arrangement switching device 16 and the sensing section. In particular, the tuning current $I_T$ may have the same polarity as the current provided to the sensing section via the switch device 16 respectively gate transistor $T_5$. It may be feasible that the tuning arrangement 24 provides a tuning current to the storage arrangement 14. The tuning current may be provided at a connection point between the storage section and the storage arrangement switch device 20, bypassing the storage arrangement switch device 20. In this case, the tuning current may have the opposite polarity of the current provided to the storage section via the switch device 20. It may also be considered to provide tuning currents to both the storage arrangement and the sensing arrangement. In this variant, the polarities of the tuning currents may be opposite. The tuning arrangement may also be adapted to limit a current provided to the storage section and/or the sensing section, e.g. by providing a resistance or by providing a parallel current path. The asymmetry between the storage arrangement and the sensing arrangement may effect the relative durations of the sense period and the store period. Assuming comparable transistors are used for the input differential pair and the regenerative pair, the use of a tuning arrangement 24 as described above will lead to the sense period being longer than the store period, even though the clock signals provided externally have not changed. Alternatively or additionally, it may be feasible to adapt the tuning arrangement 24 such that it may increase the current level of the storage arrangement and/or decrease the current level of the sensing arrangement, e.g. by providing a tuning current or tuning currents of opposite polarity than described above. An asymmetry can also be introduced by choosing different types of electronic components, e.g. different transistors. In such a case, the tuning arrangement 24 may be adapted to provide a bias taking into account the asymmetry already present in the system.

The tuning arrangement, in particular the base terminal of transistor $T_T$, may be connected or connectable to receive a tuning signal or tuning voltage $V_{tune}$. The tuning voltage $V_{tune}$ respectively the tuning signal may represent a temperature measured by a temperature sensor. The temperature sensor may be provided on or near the latch circuit 10 to provide a measurement of the actual temperature of the latch circuit 10. It can be envisioned that the tuning voltage at least in the operating range of interest is linearly dependent of the temperature determined by the temperature sensor. The slope of the linear dependency may be 10 mV/K. Any other suitable linear dependency may be considered. A chosen value for a linear dependency may be based on characteristics of the latch circuit 10, in particular of the transistors $T_1$, $T_2$, $T_3$ and $T_4$ used for sensing and storing a signal.

It is feasible that a control unit capable of tuning respectively biasing a current of the sensing arrangement and/or the storage arrangement of an associated latch circuit 10 based on a temperature signal is provided. The control unit may be provided as part of the tuning arrangement 24. It may also be provided separately, but connected to provide a control signal or a control voltage respectively a tuning voltage to the tuning arrangement 24 based on a temperature signal provided by a temperature sensor. The control unit may be adapted to bias a current based on characteristics of the latch circuit 10 and/or components of the latch circuit 10. A characteristic may e.g. describe the relation between a tuning current or tuning voltage controlling a tuning current and the self-oscillatory frequency at a certain temperature. Characteristics may be determined experimentally and/or theoretically. The control unit may comprise a memory unit for storing characteristics data. The control unit may comprise a microcontroller, central processing unit and/or a memory, e.g. random access memory or a read-only memory.

A flip-flop circuit comprising at two or more latch circuits may be considered. It may be considered that at least one of the latch circuits is a latch circuit 10 as described herein.

Figure 2:
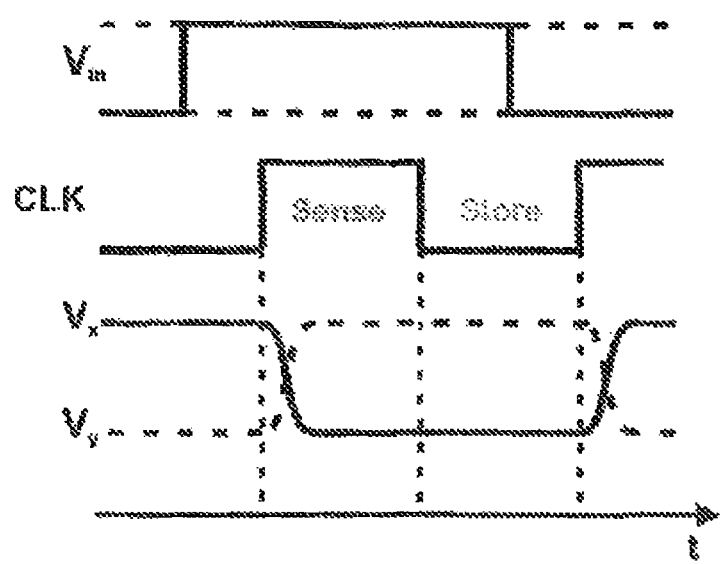
FIG. 2 schematically shows the behaviour of a latch circuit under ideal conditions.
Figure 3:
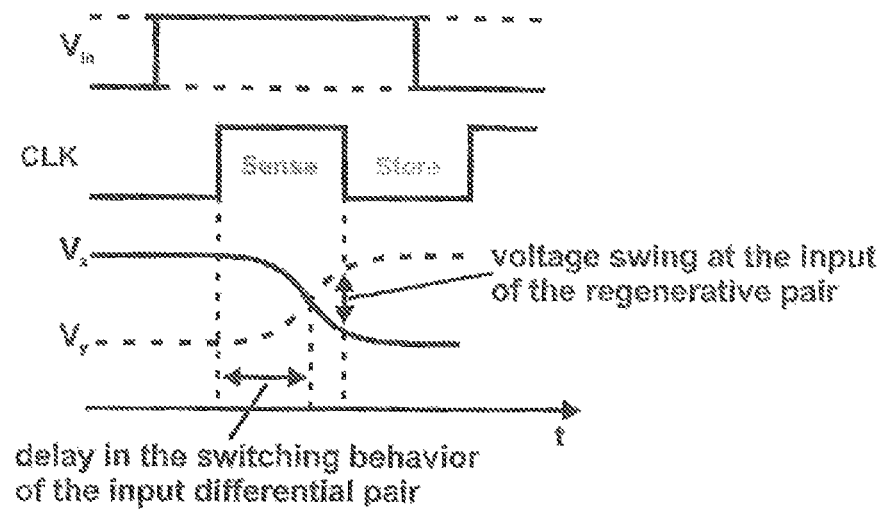
FIG. 3 schematically shows the behaviour of the latch circuit subject to a temperature drift.
Figure 4:
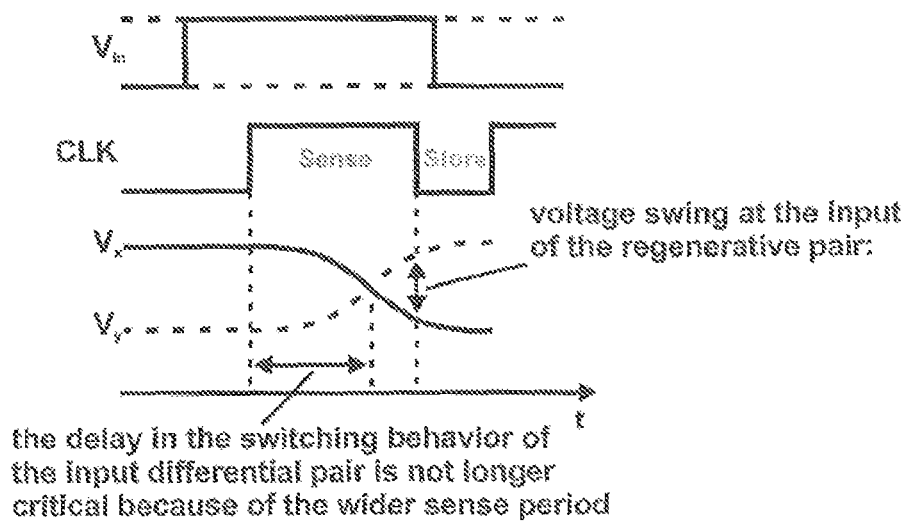
FIG. 4 schematically shows the behaviour of the latch circuit subject to a temperature drift with an additional sense current.

FIGS. 2 to 4 schematically show time behaviours of a latch circuit. In the upper row, an input signal $V_{in}$ applied to terminals D, $D_n$ is shown. In the line below, a signal phase CLK based on the clock signal as seen behind the gate transistors $T_5$, $T_6$ is shown, which might be modified by a tuning current. Below, the behaviour of voltages $V_x$ and $V_y$ at nodes 15, 19 is illustrated.

FIG. 2 shows the time behaviour of a latch circuit without temperature drift close to its ideal behaviour. As can be seen in FIG. 2, for an almost ideal sensing and storage arrangement, the voltage $V_x$ shows a quick decay during a sense and store period, and it quickly rises in the next sense period, e.g. triggered by the rising edge of a CLK signal. Voltage $V_y$ shows a complementary behaviour. It should be noted for both voltages $V_x$ and $V_y$, the transition time to reach a new stable value is short in comparison to the total time the sensing arrangement actually senses the input signal. In particular, a cross-over respectively voltage swing of the voltages $V_x$ and $V_y$ occurs well during the sense period.

FIG. 3 schematically shows the behaviour of a latch circuit with increased temperature. The increased temperature slows down the operational speed of the semiconductor components and of the latch circuit and in particular leads to delaying effects during the transitions. As can be seen from FIG. 3 at an increased temperature there is a delay in the switching behaviour of the input differential pair of transistors $T_1$, $T_2$ of the sensing arrangement. Also, for high frequencies, the voltage swing at the input of the regenerative pair $T_4$, $T_5$ of the storage arrangement gets increasingly difficult to catch within the sense period. The delay in the switching behaviour of the input differential pair leads to the effect that the sensing period essentially is dominated by the transitions. This may lead to an undesired decrease in the self oscillatory frequency respectively the operating frequency of a flip-flop circuit based on two latch circuits.

FIG. 4 schematically shows the time behaviour for the case that a tuning current is provided to the sensing arrangement as shown in FIG. 1. The tuning current causes a bias respectively an unbalancing or an asymmetry in the current levels of the sensing arrangement and the storage arrangement. Utilizing the tuning current may also be seen as asymmetrically operating the flip-flop. The asymmetry may come from providing the sensing arrangement with an increased amount of current in comparison to the storage arrangement. It may be envisioned to lower a current provided to the regenerative transistors $T_4$, $T_5$ of the storage arrangement 14, e.g. by injecting a current with an opposite direction to the current flowing from supply rail $V_{ee}$ via gate transistor $T_6$ to the regenerative transistors $T_3$, $T_4$. There may be provided a suitable connection drawing some of the current provided by the current source such that it runs parallel to the storage section instead through it, such that a lower current is provided to transistors $T_4$, $T_5$ than to transistors $T_1$, $T_2$.

As can be seen in FIG. 4, by providing the tuning current to the sense section, the time available for sensing is increased, while the time available for storing is reduced. Thus, the sense period is large enough such that the delay in the switching behaviour of the input differential pair of transistors $T_1$, $T_2$ becomes less critical. Due to the voltage swing at the input of the regenerative pair of transistors $T_3$, $T_4$ occurring well within the sense period, the latch circuit is still able to a write respectively store a logic level. The effective self-oscillatory frequency of the latch circuit may be increased due to the asymmetrical operation of the sensing arrangement and storage arrangement by shifting the lengths of the sense and store periods. It may also be considered to shorten the length of the sense period to decrease the self oscillatory frequency by introducing a corresponding bias utilizing a tuning arrangement.

Figure 5:
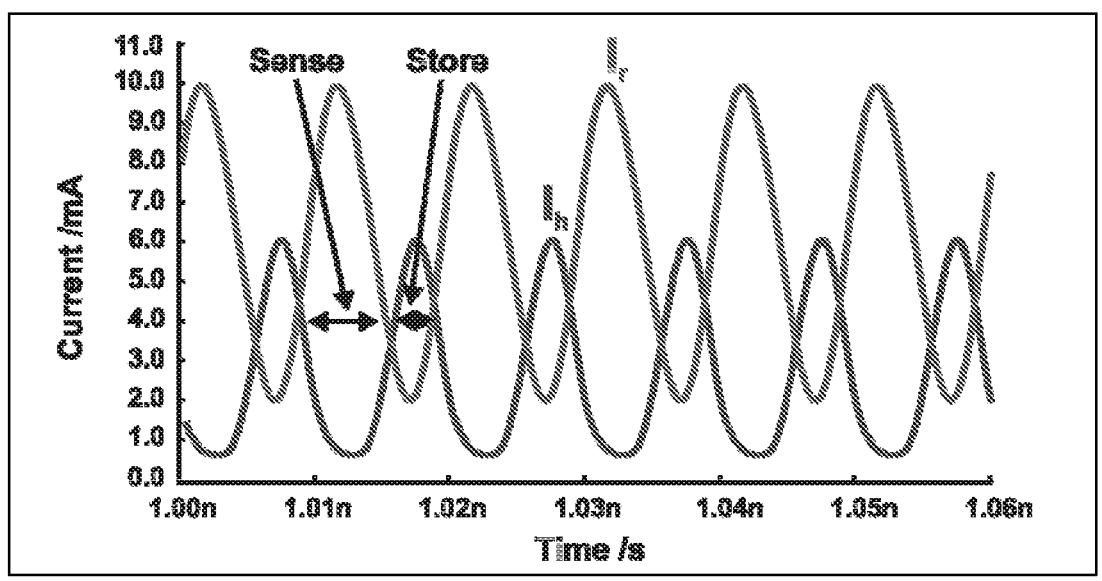
FIG. 5 schematically shows the time behaviour of currents during sense and store periods when a temperature controlled tuning current is employed.

FIG. 5 shows in the upper curve the time behaviour of current $I_r$ flowing between the sensing arrangement switch device 16, respectively transistor $T_5$, and the sensing section, respectively sensing transistors $T_1$, $T_2$. Time is denoted in nanoseconds. The second, lower curve $I_h$ shows the time behaviour of the current between the storage arrangement switch device 20, respectively gate transistor $T_6$, and the storage section, respectively the regenerative pair of transistors $T_3$, $T_4$, of the storage arrangement 14. As can been seen, the curve $I_r$ is phase shifted in respect to the curve $I_h$ of the storage arrangement. The curve $I_r$ is also shifted to a higher base level, due to the tuning current $I_T$ being provided circumventing the switch device 16, so that the tuning current $I_T$ may be applied even during times the switch device 16 is switched off. Thus, the periods of sensing represented by the rising edge of the pulse of curve $I_r$ crossing the falling edge of a pulse of $I_h$ on one side and the falling edge of the pulse of $I_r$ crossing the rising edge of the subsequent pulse of $I_h$ is longer than the corresponding period for storing. The difference between the lowest level of current $I_r$ and the lowest level of current $I_h$ corresponds to the tuning current $I_T$. It may be considered that the tuning current represents a bias current for the sensing current $I_r$.

Figure 6:
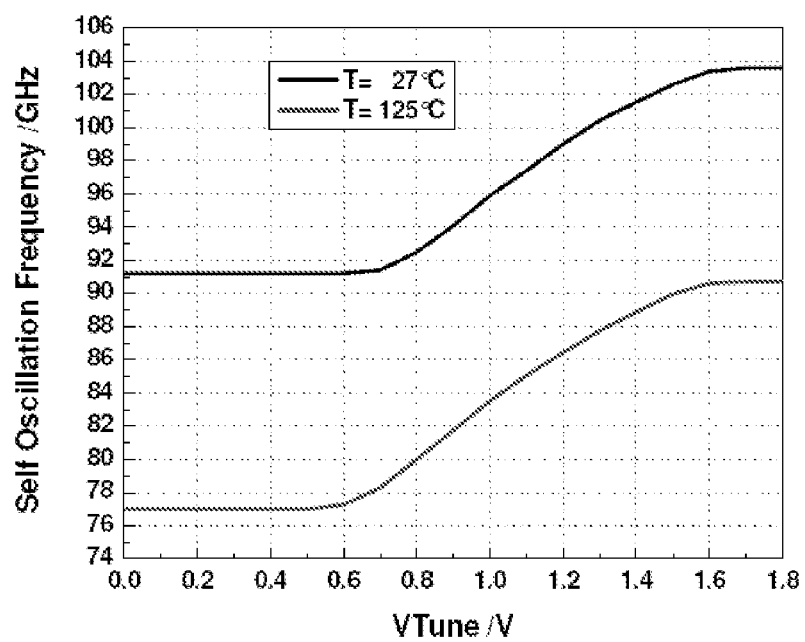
FIG. 6 shows measurement results on how a self-oscillation frequency of a frequency divider comprising a latch circuit changes when using a temperature-dependent tuning voltage.

FIG. 6 shows measurement results of a self-oscillation frequency of a frequency divider based on a latch circuit as shown in FIG. 1 versus a tuning voltage regulating a tuning current. It can be assumed that the tuning voltage and the tuning current have a linear relation in the region of interest. The upper line corresponds to a temperature of 27° C. of the frequency divider as measured by a temperature sensor. The lower curve represents the self-oscillation frequency of the same frequency divider at a temperature of 125° C. The dashed line in the middle represents the ordinary self-oscillation frequency at a normal temperature of 27° C. and a low or no tuning voltage. This frequency may be seen as the nominal self-oscillation frequency of the frequency divider. As soon as the tuning voltage reaches approximately 0.7 V and begins to open the tuning switch, in this case transistor $T_T$, the self-oscillation frequency begins to rise for both temperatures. For the temperature of 27° C., there is an almost linear dependency between the increased self-oscillation frequency and the tuning voltage for a range of approximately 0.8 V to 1.3 V. For the higher temperature of 125° C., the linear dependency holds for an even larger voltage region. For high tuning voltages, both curves run into a saturation. For a temperature of 125° C., the saturation frequency corresponds to the nominal self-oscillation frequency. As can be seen, by using a suitable tuning voltage, the frequency divider may be operated at its nominal self-oscillation frequency at least up to a temperature of 125° C. Thus, the sensitivity and efficiency of the frequency divider can be increased and the frequency divider can be run in the originally desired locking or operational range even at high temperatures.

Figure 7:
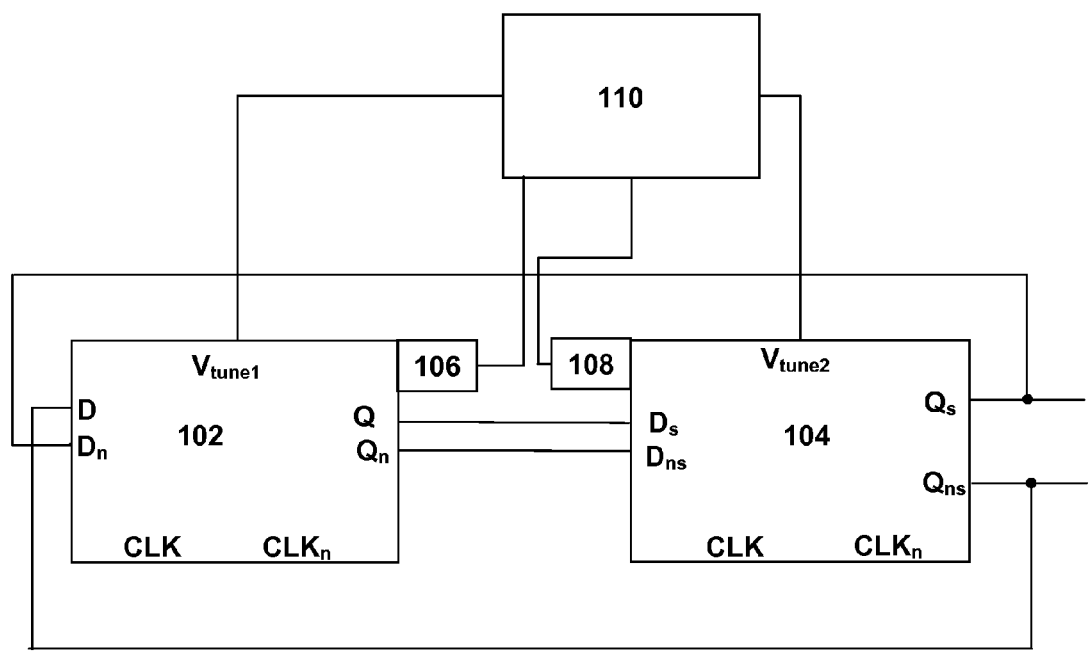
FIG. 7 schematically shows a flip-flop based frequency divider in which two latches are utilized.

FIG. 7 schematically shows a frequency divider 100 using two latch circuits 10 as described above. The frequency divider 100 may comprise a first latch circuit and a second latch circuit, the first latch circuit providing a first output signal based as an input signal for the second latch circuit, the first latch circuit and/or the second latch circuit being a latch circuit as described above.

One of the latch circuits may be run as a master latch circuit 102, whereas the second latch circuit 104 may be operated as a slave. The master flip-flop 102 may be provided with an external clock signal CLK and its complement $CLK_n$ and a differential input signal via its terminals D, $D_n$, CLK, $CLK_n$. The outputs Q, $Q_n$ of the master latch circuit 102 may be connected to the inputs $D_{ns}$ and $D_s$ of the slave circuit 104. The slave circuit 104 may be provided with clock signals CLK and $CLK_n$ and may provide output signals $Q_s$, $Q_{ns}$ with a frequency corresponding to a frequency of the clock signal divided by two via corresponding terminals. The output signals $Q_s$, $Q_{ns}$ of slave latch circuit 104 may be provided as an additional input to the master latch circuit 102 in an inverted manner. I.e. the input terminal D may be provided with the signal corresponding to $Q_{ns}$ whereas input terminal $D_n$ may be provided with the signal $Q_s$. Master latch circuit 102 may comprise a temperature sensor 106 arranged to measure the temperature of the master circuit 102 and to provide a corresponding temperature signal. Slave latch circuit 104 may comprise a temperature sensor 108 arranged to measure the temperature of slave latch circuit 104. Temperature sensor 108 may provide a corresponding temperature signal. It may be feasible to provide only one temperature sensor. In particular, for highly integrated circuits, in which the master latch circuit 102 and the slave latch circuit 104 are located in close proximity, one temperature sensor may be arranged to provide temperature information or a corresponding signal for both circuits. One temperature sensor may be adapted to provide a temperature signal to the master latch circuit 102 and/or the slave latch circuit 104. A frequency divider may comprise more than two flip-flops connected in series and/or in parallel. Any suitable number of flip-flops may comprise a temperature sensor.

The frequency divider 100 may comprise a control device 110 adapted to receive temperature signals of the one or more temperature sensors 106, 108 and to control one or more tuning arrangements of flip-flops circuits 102, 104 based on the temperature signals. In particular, the control device 110 may provide tuning voltages $V_{tune1}$ and $V_{tune2}$ to tuning arrangements of the latch circuits 102, 104. The control device 110 may provide a tuning voltage based on a temperature signal or a plurality of tuning voltages based on one or more temperature signals. The tuning voltages or temperature signals may differ from each other e.g. due to different temperatures measured or due to different characteristics of latch circuits tuned respectively controlled. The control device 100 may comprise a microcontroller, central processing unit and/or a memory, e.g. random access memory or a read-only memory.

In the foregoing specification, the invention has been described with reference to specific examples of embodiments of the invention. It will, however, be evident that various modifications and changes may be made therein without departing from the broader spirit and scope of the invention as set forth in the appended claims.

According to the invention, an operational frequency of a latch-based flip-flop circuit may be controlled depending on a temperature, in particular a temperature of a latch circuit respectively the flip-flop circuit. In particular, a bias is introduced to a sense section or a storage section of a latch circuit to change the relative durations of a sense period and a store period. This enables avoiding a temperature drift of the frequency due to the circuit heating up during use or due to external conditions, leading to an efficient and consistent operation of the latch circuit respectively flip-flop circuit over a wide range of temperatures. The latch circuit and flip-flop circuit may be operated with a high sensitivity to a given input signal even at changing temperatures. A flip-flop based frequency divider may be operated to reliably and efficiently provide a desired frequency division of signal.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the sensing section may be seen as being separate from the sensing arrangement switching device, or they may be components of a common circuitry. An analogous statement holds for the storage section and the storage arrangement switching device. For the transistors, any kind of suitable transistor may be utilized. A transistor e.g. may be a bipolar junction transistor, a field effect transistor, a MOSFET (metal-oxide-semiconductor field-effect transistor), JFET (junction gate field-effect transistor) or any other kind of transistor. For different transistors, different types of transistors may be utilized. For example, the type of transistor used for one of the transistors of the input differential pair may be different from the type of transistor used for the gate transistors.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the transistors respectively the latch circuits may be implemented on a common substrate. Alternatively, the examples may be implemented as any number of separate integrated circuits or separate devices interconnected with each other in a suitable manner. For example, each latch circuit may be implemented as individual module, wherein the modules may be interconnected. Also for example, the examples, or portions thereof, may implemented as soft or code representations of physical circuitry or of logical representations convertible into physical circuitry, such as in a hardware description language of any appropriate type.

The semiconductor substrate described herein can be any semiconductor material or combinations of materials, such as gallium arsenide, silicon germanium, silicon-on-insulator (SOI), silicon, monocrystalline silicon, the like, and combinations of the above.

In the foregoing specification, the invention has been described with reference to specific examples of embodiments of the invention. It will, however, be evident that various modifications and changes may be made therein without departing from the broader spirit and scope of the invention as set forth in the appended claims.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A latch circuit comprising:
a sensing arrangement comprising:
one or more sensing transistors adapted to sense an input signal and to provide a first signal based on the sensed input signal, and
a sensing arrangement switch device connected or connectable to a first current source, the sensing arrangement switch device being adapted to switch on or off a current to the one or more sensing transistors based on a first clock signal;
wherein the latch circuit further comprises a storage arrangement comprising:
one or more storage transistors adapted to store the first signal and to provide a second signal based on the first signal, and
a storage arrangement switching device connected or connectable to the first current source or a second current source, the storage arrangement switching device being adapted to switch on or off a current to the storage transistors based on a second clock signal;
wherein the latch circuit further comprises:
a tuning arrangement connected or connectable to a temperature sensor), the tuning arrangement being adapted to bias a current of the sensing arrangement and/or the storage arrangement based on a temperature signal provided by the temperature sensor.

2. The latch circuit of claim 1, wherein the tuning arrangement is connected or connectable to the first, the second or a third current source.

3. The latch circuit of claim 2, wherein the tuning arrangement provides a tuning current for biasing the current of the sensing arrangement and/or the storage arrangement.

4. The latch circuit according to claim 3, wherein the tuning arrangement is connected to a connection point between a sensing section of the sensing arrangement and the sensing arrangement switch device and/or to a connection point between a storage section of the storage arrangement and the storage arrangement switch device to bias the current of the sensing arrangement and/or the storage arrangement.

5. The latch circuit according to claim 3, wherein the tuning arrangement is adapted to bias the current level of the sensing arrangement and/or the storage arrangement such that the current level in the sensing arrangement when the sensing arrangement switch device is switched off is higher than the current level in the storage arrangement when then storage arrangement switch device is switched off.

6. A flip-flop circuit comprising two or more latch circuits, at least one of the latch circuits being a latch circuit according to claim 3.

7. The latch circuit of claim 2, wherein the tuning arrangement provides a tuning voltage for controlling a tuning current, the tuning voltage depending linearly on the temperature signal.

8. The latch circuit according to claim 2, wherein the tuning arrangement is connected to a connection point between a sensing section of the sensing arrangement and the sensing arrangement switch device and/or to a connection point between a storage section of the storage arrangement and the storage arrangement switch device to bias the current of the sensing arrangement and/or the storage arrangement.

9. The latch circuit according to claim 2, wherein the tuning arrangement is adapted to bias the current level of the sensing arrangement and/or the storage arrangement such that the current level in the sensing arrangement when the sensing arrangement switch device is switched off is higher than the current level in the storage arrangement when then storage arrangement switch device is switched off.

10. The latch circuit according to claim 2, wherein the tuning arrangement is adapted to provide a current to the storage arrangement in a direction opposite to a direction of the current switched on by the storage arrangement switching device.

11. A flip-flop circuit comprising two or more latch circuits, at least one of the latch circuits being a latch circuit according to claim 2.

12. The latch circuit according to claim 1, wherein the tuning arrangement is connected to a connection point between a sensing section of the sensing arrangement and the sensing arrangement switch device and/or to a connection point between a storage section of the storage arrangement and the storage arrangement switch device to bias the current of the sensing arrangement and/or the storage arrangement.

13. The latch circuit according to claim 1, wherein the tuning arrangement is adapted to bias the current level of the sensing arrangement and/or the storage arrangement such that the current level in the sensing arrangement when the sensing arrangement switch device is switched off is higher than the current level in the storage arrangement when then storage arrangement switch device is switched off.

14. The latch circuit according to claim 12, wherein the tuning arrangement is adapted to bias the current level of the sensing arrangement and/or the storage arrangement such that the current level in the sensing arrangement when the sensing arrangement switch device is switched off is higher than the current level in the storage arrangement when then storage arrangement switch device is switched off.

15. The latch circuit according to claim 1, wherein the tuning arrangement is adapted to provide a current to the storage arrangement in a direction opposite to a direction of the current switched on by the storage arrangement switching device.

16. The latch circuit of claim 1, wherein the tuning arrangement comprises a temperature sensor.

17. A flip-flop circuit comprising two or more latch circuits, at least one of the latch circuits being a latch circuit according to claim 1.

18. A frequency divider comprising at least one latch circuit according to claim 1.

19. The frequency divider according to claim 18, comprising a first latch circuit and a second latch circuit, the first latch circuit providing a first output signal as an input signal for the second latch circuit, the first latch circuit and/or the second latch circuit being a latch circuit according to claim 1.

20. The frequency divider according to claim 18, the frequency divider comprising a control device adapted to receive temperature signals of one or more temperature sensors and to control one or more tuning arrangements of latch circuits based on the temperature signals.

\* \* \* \* \*